United States Patent [19]
Wong et al.

[11] Patent Number: 6,028,771
[45] Date of Patent: Feb. 22, 2000

[54] COVER FOR AN ELECTRONIC CARTRIDGE

[75] Inventors: Thomas Wong, Seattle; Michael Crocker, Tacoma; Peter Davison, Sumner; Mike MacGregor; Joe Benefield, both of Olympia, all of Wash.

[73] Assignee: Intel Corporation, Santa Clara, Calif.

[21] Appl. No.: 09/189,905

[22] Filed: Nov. 11, 1998

[51] Int. Cl.[7] ....................................................... H05K 7/20

[52] U.S. Cl. .......................... 361/704; 361/715; 361/752; 361/759

[58] Field of Search .................................. 165/80.2, 80.3, 165/185; 174/16.3; 361/690, 704, 707, 709–710, 715–716, 719–721, 730, 732, 737, 740–741, 752, 756, 759, 801, 802

[56] References Cited

U.S. PATENT DOCUMENTS

| | | | |
|---|---|---|---|
| 3,631,299 | 12/1971 | Meyer et al. | 361/752 |
| 4,226,491 | 10/1980 | Kazama et al. | 361/759 |
| 4,573,104 | 2/1986 | Kamada | 361/756 |
| 5,838,542 | 11/1998 | Nelson et al. | 361/704 |
| 5,856,910 | 1/1999 | Yurchenco et al. | 361/704 |
| 5,894,408 | 4/1999 | Stark et al. | 361/704 |

*Primary Examiner*—Gregory Thompson
*Attorney, Agent, or Firm*—Blakely, Sokoloff, Taylor & Zafman LLP

[57] ABSTRACT

A cover for a substrate of an electronic assembly. The cover may include a snap-in pin that can be inserted through an opening of the substrate. The cover may also have a barbed pin that exerts a force onto the substrate. The force secures the pin to the substrate. The snap-in pin and barbed pin may extend from a panel portion of the cover which covers one side of the substrate. The entire cover may be constructed as a relatively inexpensive plastic injection molded part.

16 Claims, 3 Drawing Sheets

COVER FOR AN ELECTRONIC CARTRIDGE

BACKGROUND OF THE INVENTION

1. Field of the Invention

The present invention relates to a cover for an electronic assembly.

2. Background Information

FIG. 1 shows a product marketed by Intel Corporation, the assignee of this application, which is referred to as a single edge contact cartridge (SECC). The Intel SECC includes a microprocessor which is assembled into a package 1 that is mounted to a substrate 2. The SECC may also have other integrated circuit packages 3 which contain static random access memory (SRAM) integrated circuits.

One edge of the substrate 2 has a plurality of contact pads 4 which can be inserted into an electrical connector 5. The electrical connector 5 can be mounted to a printed circuit board 6 such as the motherboard of a computer. The pads 4 and connector 5 electrically couple the substrate 2 to the circuit board 6.

The substrate 2 and integrated circuit packages 1 and 3 are enclosed by a cover 7 and a thermal plate 8. The cover 7, plate 8 and substrate 2 provide an electronic cartridge which can be plugged into a computer. The cover 7 and thermal plate 8 are attached to each other and the substrate 2 by a number of pins and spring clips (not shown). Having individual pins and spring clips increases the cost and complexity of assembling the cartridge. It would be desirable to provide a cartridge that has less parts than the assembly shown in FIG. 1.

SUMMARY OF THE INVENTION

One embodiment of the present invention is a cover for a substrate of an electronic assembly. The cover may include a snap-in pin that can be inserted through an opening of the substrate. The cover may also have a barbed pin that exerts a force onto the substrate.

DETAILED DESCRIPTION

Figure 2:
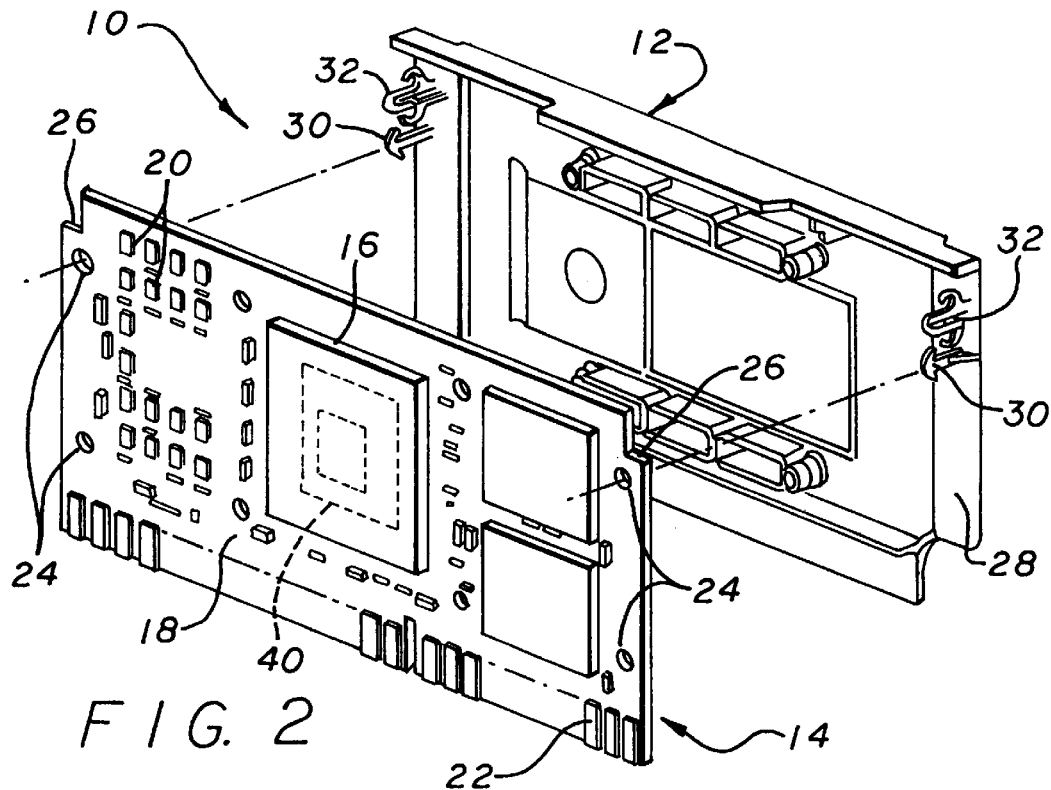
FIG. 2 is an exploded view of an embodiment of electronic assembly of the present invention.
Figure 3:
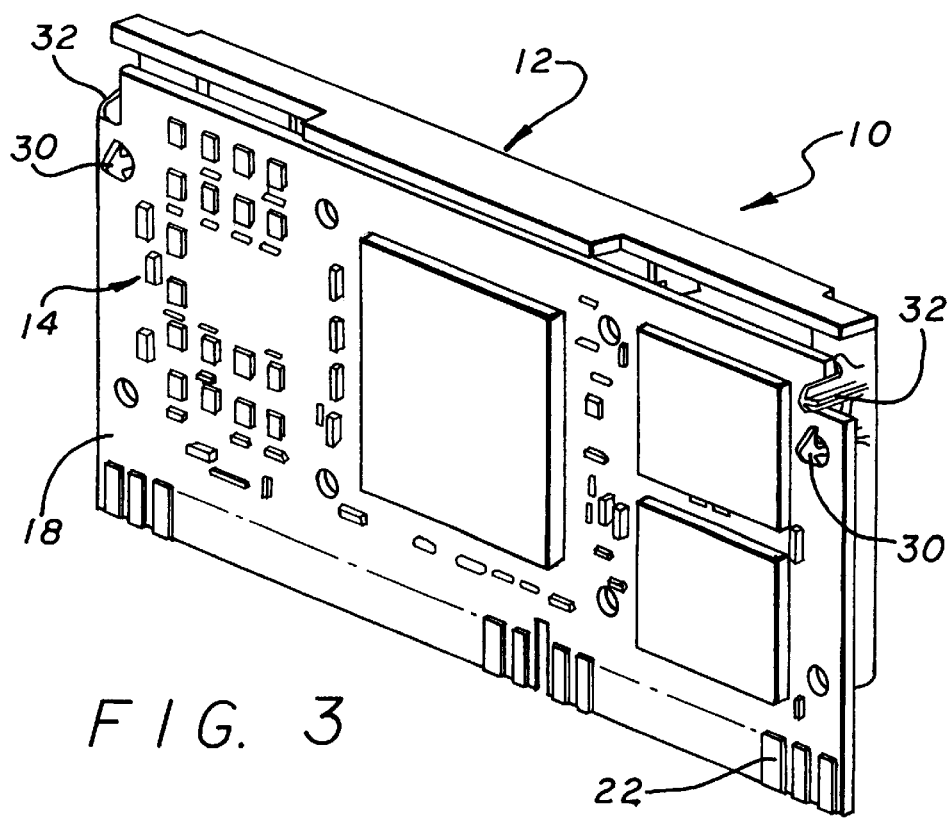
FIG. 3 is a perspective view of a partially assembled electronic assembly.

Referring to the drawings more particularly by reference numbers, FIGS. 2 and 3 show an embodiment of an electronic assembly 10 of the present invention. The assembly 10 may include a cover 12 that is coupled to a printed circuit board sub-assembly 14. The sub-assembly 14 may include one or more integrated circuit packages 16 that are mounted to a substrate 18. The sub-assembly 14 may also include a number of passive elements 20 such as capacitors and termination resistors that are soldered to the substrate 18.

The substrate 18 may be a printed circuit board which has a plurality of contact pads 22 that can be plugged into an electrical connector (not shown). The substrate 18 may also have a plurality of openings 24 and a pair of notches 26.

The cover 12 may include a panel 28 that covers one side of the printed circuit board sub-assembly 14. Extending from the panel 28 are a pair of snap-in pins 30 and a pair of adjacent barbed pins 32 that are used to attach the cover 12 to the substrate 18. The cover 12 may be constructed as a plastic injection molded part which is relatively inexpensive to produce in mass production quantities.

Figure 4:
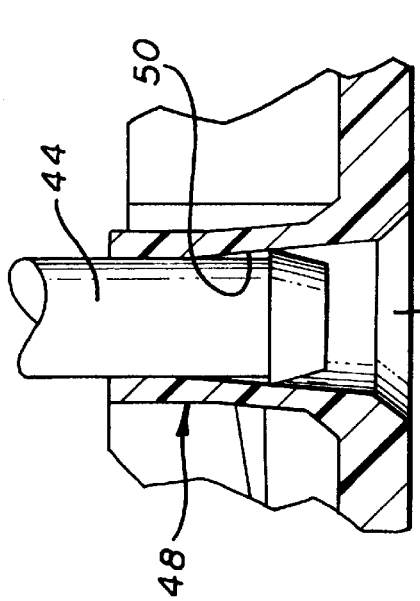
FIG. 4 is a side sectional view showing a cover attached to a substrate of the assembly.

As shown in FIG. 4, the snap-in pins 30 may be inserted through the openings 24 of the substrate 18. Each pin 30 may have a V-shaped head 34 that prevents the pin 30 from being pulled out of the opening 24. The heads 34 are deflected when the pins 30 are inserted through the openings 24. The pins 30 prevent separation of the cover 12 and the substrate 18 after assembly.

The barbed pins 32 each have a center pin 36 that extends through a notch 26 of the substrate 18. The center pins 36 provide lateral restraint of the cover 12. Each pin 32 may also have a pair of barbs 38 which engage the substrate 18. The barbs 38 are deflected when the cover 12 is assembled onto the substrate 18. The deflected barbs 38 exert spring forces and corresponding moments that press the substrate 18 into the V-shaped heads 34 of the pins 30. The moments prevent relative movement between the cover 12 and substrate 18 so that the assembly 10 does not "rattle" when subjected to vibrational loads.

Figure 5:
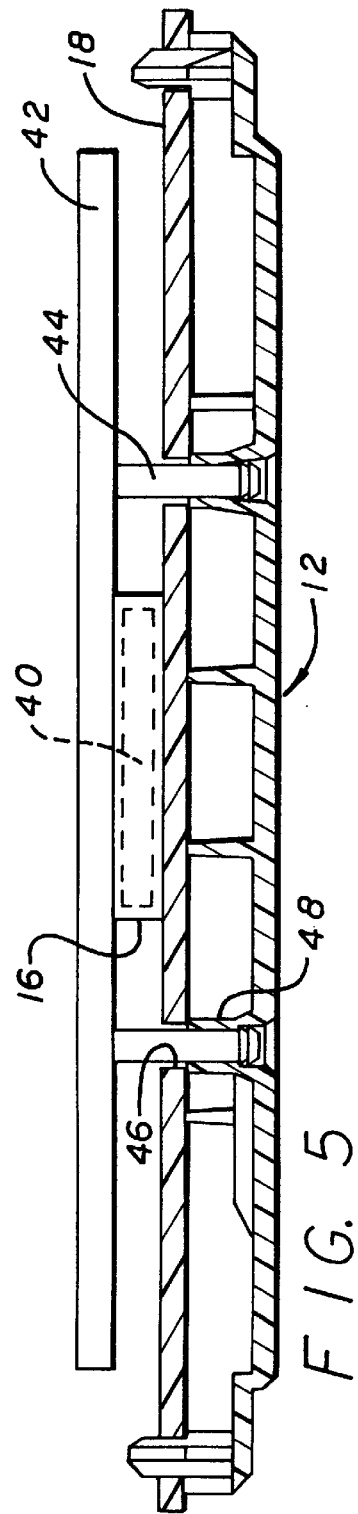
FIG. 5 is a side sectional view showing that attachment of a thermal element to the cover.

As shown in FIG. 5, the integrated circuit package 16 may contain an integrated circuit 40 that generates heat. The assembly may include a thermal element 42 that is coupled to the package 16 to remove the heat generated by the integrated circuit 40. The thermal element 42 may have a pair of fasteners 44 that extend through corresponding clearance holes 46 in the substrate and are attached to bosses 48 of the cover 12.

Figure 6:
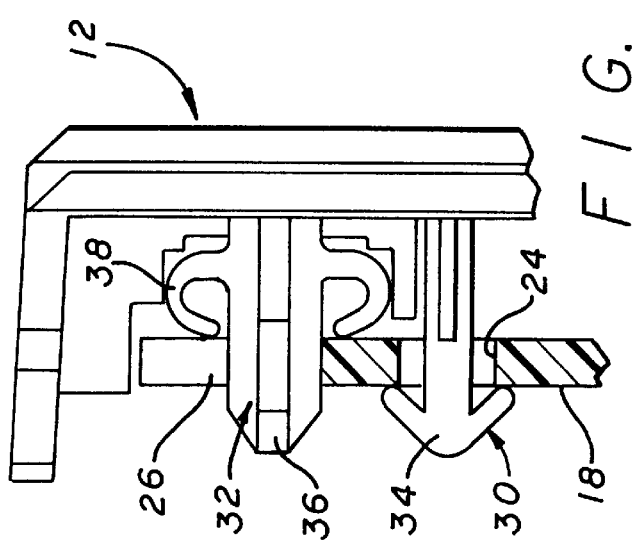
FIG. 6 is an enlarged sectional view showing a barbed fastener embedded within a boss of the cover.

As shown in FIG. 6, each fastener 44 may be barbed and become embedded into an inner channel 50 of a boss 48. The inner channel 50 may have a diameter that is approximately equal to the major diameter of the barbed fastener 44 to create an interference fit. Each boss 48 may have a tapered/countersunk opening 52 that allows a nut or other fastener (not shown) to be attached to a threaded non-barbed fastener (alternate embodiment) of the thermal element 42. The boss 48 of the present invention can thus accommodate different means for attaching the thermal plate 42 to the cover 12.

Figure 1:
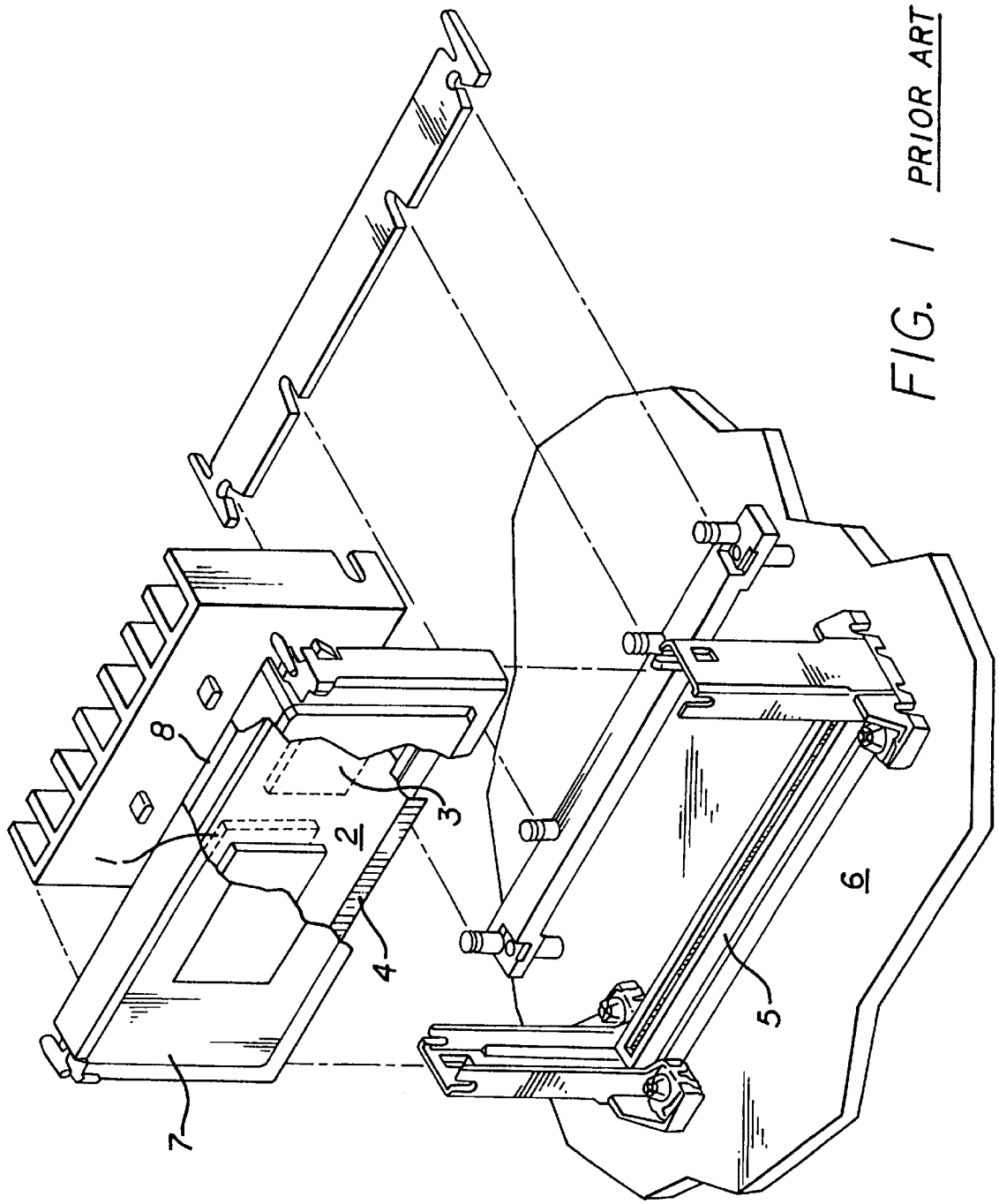
FIG. 1 is a perspective view of an electronic assembly of the prior art.

Referring to FIGS. 2 and 3, the electronic assembly 10 can be easily assembled by merely pushing the snap-in pins 30 of the cover 12 through the substrate holes 24 and pushing the fasteners 44 of the thermal element 42 into the bosses 48 of the cover 12. The cover 12 of the present invention reduces the number of parts and the complexity of assembling an electronic assembly similar to the assembly shown in FIG. 1.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A cover for an electronic assembly that includes a substrate which has an opening and a notch, comprising:

a panel;

a snap-in pin that extends from said panel and can be inserted through the opening of the substrate; and, a barbed pin that extends from said panel and applies a force to the substrate when said snap-in pin is inserted through the substrate opening.

2. The cover of claim 1, wherein said barbed pin has a center pin that extends through the notch of the substrate when the snap-in pin is inserted through the substrate opening.

3. The cover of claim 2, wherein said barbed pin has a pair of barbs that exert a spring force on the substrate when the snap-in pin is inserted through the substrate opening.

4. The cover of claim 1, wherein said snap-in pin includes a V-shaped head.

5. The cover of claim 1, further comprising a boss that extends from said panel.

6. The cover of claim 1, wherein said panel, said snap-in pin and said barbed pins are constructed as an integrally molded part.

7. An electrical assembly, comprising:
   a substrate which has a opening and a notch;
   an integrated circuit that is coupled to said substrate; and,
   a cover which has a snap-in pin that extends from a panel and through said opening of said substrate, and a barbed pin which extends from said panel and applies a force on said substrate.

8. The assembly of claim 7, wherein said barbed pin has a center pin that extends through said notch of said substrate.

9. The assembly of claim 7, wherein said barbed pin has a pair of barbs that exert a spring force on said substrate.

10. The assembly of claim 9, wherein said barbs create a moment on said substrate.

11. The assembly of claim 7, wherein said snap-in pin includes a V-shaped head.

12. The assembly of claim 7, wherein said cover includes a boss that extends from a panel.

13. The assembly of claim 7, wherein said panel, said snap-in pin and said barbed pin are constructed as an integrally molded part.

14. The assembly of claim 12, further comprising a thermal element that is thermally coupled to said integrated circuit by a fastener that is attached to said boss of said cover.

15. A method for assembling an electronic assembly, comprising:
   inserting a snap-in pin of a cover through a substrate opening and a barbed pin of said cover into engagement with the substrate so that the barbed pin exerts a spring force on the substrate.

16. The method of claim 15, further comprising the step of attaching a thermal element to the cover.

* * * * *